(12) United States Patent
Nakaya et al.

(10) Patent No.: US 6,991,386 B2
(45) Date of Patent: Jan. 31, 2006

(54) IMAGE FORMING APPARATUS AND IMAGE FORMING METHOD

(75) Inventors: Daisuke Nakaya, Kanagawa (JP); Toru Katayama, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 9 days.

(21) Appl. No.: 10/879,577

(22) Filed: Jun. 30, 2004

(65) Prior Publication Data

US 2005/0002070 A1  Jan. 6, 2005

(30) Foreign Application Priority Data

Jul. 2, 2003 (JP) .............................. 2003-190010
Jul. 10, 2003 (JP) .............................. 2003-194740

(51) Int. Cl.
  *B41J 3/42*   (2006.01)
  *B41J 21/17*  (2006.01)
  *B41J 11/44*  (2006.01)
(52) U.S. Cl. .............................. 400/72; 400/70; 400/76
(58) Field of Classification Search .................. 400/62, 400/70, 76; 348/416.1, 207.99, 373, 335; 358/1.9, 1.16, 501; 399/49; 382/236; 345/473, 345/419
See application file for complete search history.

(56) References Cited

U.S. PATENT DOCUMENTS 5,329,599 A * 7/1994 Curry et al. ................. 382/266
5,383,754 A * 1/1995 Sumida et al. ................. 412/11
5,561,477 A * 10/1996 Polit ........................... 348/700
5,707,925 A * 1/1998 Akada et al. ................ 503/227
6,021,258 A * 2/2000 Ishizu et al. ................. 358/1.9
6,243,139 B1 * 6/2001 Takahashi et al. ........ 348/420.1
6,285,711 B1 * 9/2001 Ratakonda et al. ..... 375/240.16
6,687,386 B1 * 2/2004 Ito et al. ...................... 382/103
2003/0095272 A1 * 5/2003 Nomizu ....................... 358/1.9

FOREIGN PATENT DOCUMENTS

JP       2000-122303 A    4/2000
JP          3200020 B2    6/2001

* cited by examiner

Primary Examiner—Andrew H. Hirshfeld
Assistant Examiner—Wasseem H. Hamdan
(74) Attorney, Agent, or Firm—Sughrue Mion, PLLC

(57) ABSTRACT

The invention provides an image forming apparatus and an image forming method which can correct displacement of a forming position of an image with high accuracy even when a recording medium is strained into an arbitrary shape. Positional information representing positions of each of multiple locating holes made in advance on a printed wire board (PWB) is obtained by a camera, a forming area of a wiring pattern image on the PWB is virtually divided into multiple quadrilateral areas on the basis of the positional information, in each divided area, raster data showing the image is converted so that, when it is assumed that there is no strain on the PWB, a formed wiring pattern image is matched to an image formed on a corresponding divided area, and, on the basis of the raster data after conversion, the image is formed on the PWB.

10 Claims, 15 Drawing Sheets

FIG.6A
FIG.6B
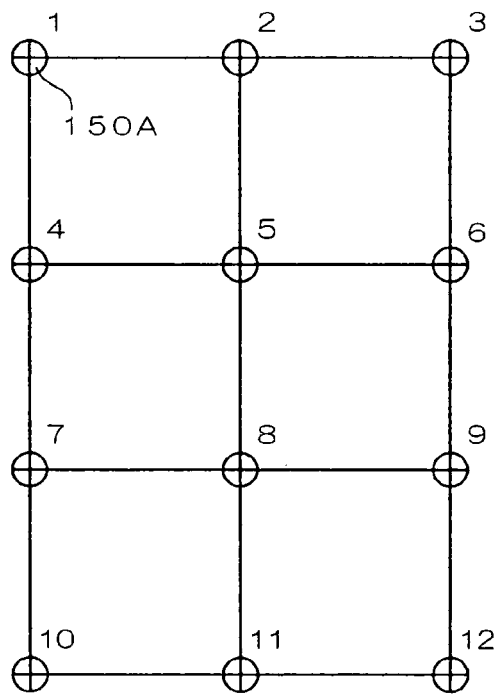
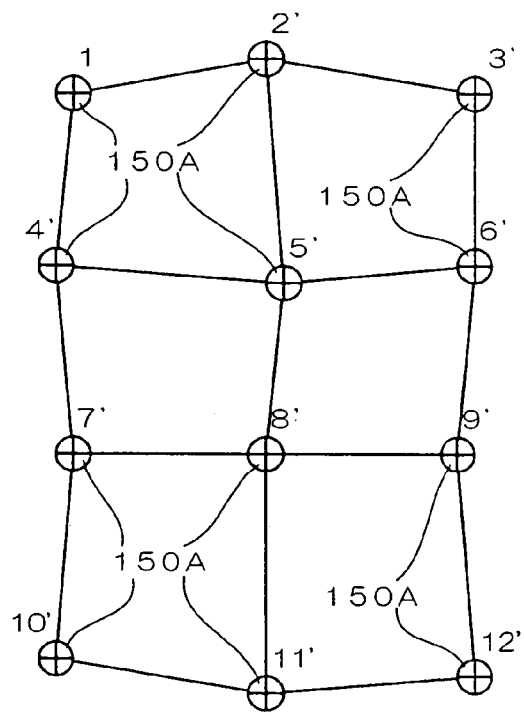

X=ax+by+c
Y=dx+ey+f

IMAGE AFTER DEFORMATION

REFERENCE POSITION
(POSITION OF LOCATING HOLE)

IMAGE BEFORE DEFORMATION

IMAGE FORMING APPARATUS AND IMAGE FORMING METHOD

CROSS-REFERENCE TO RELATED APPLICATION

This application claims priority under 35 USC 119 from Japanese Patent Applications No. 2003-190010 and No. 2003-194740, the disclosures of which are incorporated by reference herein.

BACKGROUND OF THE INVENTION

1. Field of the Invention

The present invention relates to an image forming apparatus, to an image forming method and to an image storage medium, particularly to an image forming apparatus, an image forming method and an image storage medium useful for forming an image on a board such as a printed wiring board or a flat panel display board.

2. Description of the Related Art

A surface exposure apparatus using a mask has been widely used as an apparatus for forming a predetermined pattern on a printed wiring board (hereinafter referred to as "PWB"), or on a flat panel display (hereinafter referred to as "FPD") board.

However, high resolution of a pattern (wiring pattern) formed on a PWB is needed as high density mounting of components increases, and a problem arises insofar that a forming position can be displaced due to expansion and contraction of the mask, or to expansion and contraction of the board generated in a pressing process performed mainly in the heated state. For example, since, in the case of a multi-layered printed wiring board, alignment between a hole made in the board, such as a through hole, and the pattern of each layer, can not be performed with high accuracy, the inability to achieve a high density on a PWB becomes a problem.

In the case of FPDs, increases in the sizes of boards have been made in the interest of high productivity, and a problem has arisen that a lithography position can be displaced as a result of an increase in the degree of expansion and contraction of the board before and after heat treatment, or as a result of the expansion and contraction of the mask itself. For example, in forming a color filter pattern, the displacement of each color of R (red), G (green), and B (blue) becomes a problem.

Among technologies designed to solve the kind of problem mentioned above, for example, as disclosed in Japanese Patent No. 3200020, a technology has existed in which the pattern is directly formed on a recording medium without the use of a mask (hereinafter referred to as "first related art").

According to the first related art, displacement of the forming position can be corrected by controlling a frequency of a forming clock pulse, a feeding speed of a forming stage, or a starting time of forming.

Further, for example, as disclosed in Japanese Patent Application Laid-Open No. 2000-122303, a technology has also existed in which a PWB is moved in a sub-scanning direction while a light beam is scanned in a main scanning direction, and multiple surface forming patterns are formed on the PWB by modulating the light beam on the basis of lithography data; a technology has also been used in which surface forming positional information on the PWB is measured, and displacement of the forming position corrected on the basis of the surface forming positional information obtained at the time that vector data is converted into bit map data (hereinafter referred to as "second related art").

However, because the degree of expansion and contraction of a board such as a PWB or a FPD board is not isotropic, boards expand and contract not only into the shape of a rectangle or a parallelogram, but also into arbitrary shapes. Therefore, in the first related art, a problem has arisen that, as the high resolution of the forming pattern increases, displacement of forming positions can not be sufficiently corrected.

In the second related art, only the positional information of the surface forming pattern is corrected, and accordingly there has also been a problem that it has not been possible to cope with strains caused by the generation of an arbitrary shape of a board.

In view of the foregoing, the invention provides an image forming apparatus, an image forming method and an image storage medium that can correct with a high degree of accuracy displacement of a forming position of an image even when the recording medium is strained into an arbitrary shape.

SUMMARY OF THE INVENTION

In order to achieve the above object, an image forming apparatus of a first aspect of the present invention contains: an obtaining component which obtains positional information representing positions of each of a plurality of reference marks provided in advance in a recording medium on which an image is formed; a converting component which, on the basis of the positional information, virtually divides a forming area of the image in the recording medium into a plurality of geometrical areas with angular outlines, and in each divided area converts image data representing the image so that the image is matched to a corresponding image for a corresponding divided area without deformation; and a forming component which forms the image on the recording medium on the basis of the converted image data.

According to the image forming apparatus of the first aspect of the invention, the obtaining component obtains the positional information representing positions of each of the multiple reference marks provided in advance in the recording medium on which the image is formed.

The reference marks can include a number of marks that indicate a reference position such as holes, grooves, signs, characters, and figures. The obtaining component can include an imaging device that obtains the position of a reference mark by shooting and a sensor, such as a photo-interrupter, that detects the position of a reference mark by utilizing light. The recording medium includes a PWB and an FPD board.

In the invention, the converting component virtually divides a forming area of an image in the recording medium into multiple geometrical areas with angular outlines on the basis of the positional information and in each divided area converts image information representing images so that, when it is assumed that there is no strain on the recording medium, a image to be formed is matched to an image formed in a corresponding divided area. On the basis of image information as it exists after conversion the forming component forms an image on the recording medium.

In other words, in the invention, a forming area of an image is virtually divided into multiple geometrical areas with angular outlines, and in each divided area image information representing images is converted so that an image as it exists before deformation of the recording medium is matched to an image after deformation of the recording medium. Therefore, displacement of a forming position of an image can be corrected with a high degree of accuracy, even when the recording medium is strained into an arbitrary shape.

As described above, according to the image forming apparatus of the first aspect of the invention, positional information is obtained representing the positions of each of multiple reference marks provided in advance in the recording medium in which an image is formed; a forming area of an image in the recording medium is virtually divided into multiple geometrical areas with angular outlines on the basis of the positional information; in each divided area image information representing an image is converted so that, when it is assumed that there is no strain on the recording medium, a formed image is matched to an image formed in a corresponding divided area; and on the basis of image information as it exists after conversion images are formed on the recording medium. Therefore, displacement of a forming position of an image can be corrected with a high degree of accuracy, even when the recording medium is strained into an arbitrary shape.

In the invention, it is preferable that a reference mark be set to a mark that has been previously provided in the recording medium for positioning during image forming. Therefore, an additional step is not required in order to provide a reference mark, and the invention can be simply realized at low cost.

Furthermore, it is preferable that the geometrical area with angled outlines be a quadrilateral. For the conversion of image information, various methods of conversion from quadrilaterals to transformed quadrilaterals can in due course be applied.

The converting device may comprise an obtaining component which obtains positional information representing the positions of each of multiple reference marks provided in advance in a recording medium; a deriving component which, on the basis of the positional information, derives control point coordinate information representing each of the coordinates of multiple control points corresponding to positions of the multiple reference marks; an operating component which, on the basis of the control point coordinate information, operates a coordinate point of an image as it exists before deformation corresponding to an arbitrary point in the image after deformation; and a generating component which, by applying as image information of the arbitrary point image information representing an image before deformation of the coordinate point operated by the operating component, generates image information representing the image after deformation.

An image deformation principle of the invention will be described in detail with reference to drawings. As illustrated in FIG. 13 by way of example, in a case where it is assumed that strain has not been generated on the recording medium on which an image is formed (before deformation), the positions of multiple reference marks in the recording medium (four marks in FIG. 13) are shown by points $S_{00}$, $S_{10}$, $S_{11}$, and $S_{01}$, and the positions of multiple reference marks after deformation are shown by points $P_{00}$, $P_{10}$, $P_{11}$, and $P_{01}$.

A conventional deformation technique will be first described in which a quadrilateral including vertices of points $S_{00}$, $S_{10}$, $S_{11}$, and $S_{01}$ are deformed into a quadrilateral including vertices of points $P_{00}$, $P_{10}$, $P_{11}$, and $P_{01}$, (in this case, a FFD (Free Form Deformation) method). Each point Pij (i=0, 1 and j=0, 1) is referred to as a "control point."

As illustrated in FIG. 13 a coordinate S(u,v) of an image as it exists after deformation corresponding to a coordinate (u,v) ($0 \leq u \leq 1$, $0 \leq v \leq 1$) of an arbitrary point in the image before deformation can be determined by the FFD method by means of the following equation (1). At this point, an X coordinate and an Y coordinate in a coordinate system before deformation are normalized in respect of a length of each side.

$$S(u, v) = \sum_{j=0}^{1} \sum_{j=0}^{1} PijBi(u)Bj(v) \qquad (1)$$

Where $B_0(u)=1-u$ and $B_1(u)=u$, Equation (1) is developed as is set out in equation (2).

$$S(u,v) = P_{00}(1-u)\cdot(1-v) + P_{01}(1-u)\cdot v + P_{10}u\cdot(1-V) + P_{11}u\cdot v \qquad (2)$$

By use of this kind of conventional deformation processing technique, an image set to a rectangle in a coordinate space before deformation can be transformed into an image set to a quadrilateral (deformed quadrilateral) in a coordinate space after deformation.

To explain in more detail, pixel data of coordinates (u,v) in an image before deformation may be applied as pixel data of coordinate S(u,v). Although, in this case, coordinate S(u,v) has a value less than a decimal point, coordinate S(u,v) can still attain a value of the nearest coordinate by a rounding up of its value. If necessary, a case can also occur in which by interpolation processing such as linear interpolation the pixel data of a target pixel can be obtained from the pixel data of multiple points near the target coordinate. This pixel data deriving process is described to as "nearest interpolation processing."

However, although, in the FFD method, conversion processing can be performed on all pixels by changing the values of u and v, in cases where the FFD method is applied to the invention, it is unsatisfactory when an arbitrary pixel cannot be directly specified in a coordinate system after deformation.

In other words, in the invention, for the sake of convenience in image forming, it is desirable that each pixel in an image after deformation be specified in order to obtain the image data of the pixel. However, in the FFD method, because the pixel data of an image after deformation is determined on the basis of the coordinate value of the image before deformation, it is difficult to apply the FFD method without modification. The above problem occurs not only in the FFD method, but also in any image deformation technique in which pixel data of an image after deformation is determined on the basis of the coordinate value of the image before deformation.

Therefore, in the invention, as shown in FIG. 14 by way of example, the FFD method is applied from the coordinate of the image after deformation to the coordinate of the image before deformation. Consequently, u and v can be arbitrarily determined on the side of the coordinate system after the deformation, and the corresponding coordinate of the coordinate system before deformation can be determined as S(u,v). By alternating the direction of conversion in this fashion, in strict terms an error is generated in the deformation processing of the image. However, in a case where the degree of deformation in deformation processing is sufficiently small in relation to the size of the image, it is recognized that the discrepancy becomes so small that it can be ignored, and that, as in the invention, there is little actual damage in a case in which deformation of the recording medium is undertaken by deformation processing.

However, if no modification is made, the quadrilateral before conversion of the coordinate becomes a deformed quadrilateral, and the quadrilateral after transformation of the coordinate becomes a rectangle, and it is not possible to know in advance the coordinates of $P_{00}$, $P_{01}$, $P_{10}$, and $P_{11}$ which need be set in equation (1).

Therefore, in the invention, as an example the coordinate of Pij (the control point in equation (1)) is determined as follows. At first, as illustrated in FIG. 15, $S_{00}$, $S_{01}$, $S_{10}$, and $S_{11}$ are set so that coordinates of the four points before transformation become rectangular, and coordinates after transformation are set to be $D_{00}$, $D_{01}$, $D_{10}$, and $D_{11}$. Consequently, it becomes possible to apply equation (1) as a control point for each point of Dij.

$$S(u, v) = \sum_{j=0}^{1} \sum_{i=0}^{1} Dij \cdot Bi(u) \cdot Bj(v) \tag{3}$$

Because the relationship of $P_{00} \rightarrow S_{00}$, $P_{01} \rightarrow S_{01}$, $P_{10} \rightarrow S_{10}$, $P_{11} \rightarrow S_{11}$, as illustrated in FIG. 14, depends on equation (3) being tenable, the following equations (4) to (7) also become tenable. In these cases where Pij[x] indicates a value in which the X coordinate of point Pij is normalized by a length in an X direction of rectangles $S_{00}S_{01}S_{11}S_{10}$, and Pij[y] indicates a value in which the Y coordinate of point Pij is normalized by a length in a Y direction of rectangles $S_{00}S_{01}S_{11}S_{10}$.

$$S_{00} = \sum_{j=0}^{1} \sum_{i=0}^{1} Dij \cdot Bi(P_{00}[x]) \cdot Bj(P_{00}[y]) \tag{4}$$

$$S_{01} = \sum_{j=0}^{1} \sum_{i=0}^{1} Dij \cdot Bi(P_{01}[x]) \cdot Bj(P_{01}[y]) \tag{5}$$

$$S_{10} = \sum_{j=0}^{1} \sum_{i=0}^{1} Dij \cdot Bi(P_{10}[x]) \cdot Bj(P_{10}[y]) \tag{6}$$

$$S_{11} = \sum_{j=0}^{1} \sum_{i=0}^{1} Dij \cdot Bi(P_{11}[x]) \cdot Bj(P_{11}[y]) \tag{7}$$

Since the coordinate of each Pij is a known quantity, when equations (4) to (7) are expanded, equations (4) to (7) are modified to the following equations (8) to (11) by means of equation (2). In these cases $a_n$, $b_n$, $c_n$, and $d_n$ are constants.

$$S_{00} = a_0 \times D_{00} + b_0 \times D_{01} + c_0 \times D_{10} + d_0 \times D_{11} \tag{8}$$

$$S_{01} = a_1 \times D_{00} + b_1 \times D_{01} + c_1 \times D_{10} + d_1 \times D_{11} \tag{9}$$

$$S_{10} = a_2 \times D_{00} + b_2 \times D_{01} + c_2 \times D_{10} + d_2 \times D_{11} \tag{10}$$

$$S_{11} = a_3 \times D_{00} + b_3 \times D_{01} + c_3 \times D_{10} + d_3 \times D_{11} \tag{11}$$

In these cases, a matrix M is defined as in the following equation (12).

$$M = \begin{bmatrix} a_0 & b_0 & c_0 & d_0 \\ a_1 & b_1 & c_1 & d_1 \\ a_2 & b_2 & c_2 & d_2 \\ a_3 & b_3 & c_3 & d_3 \end{bmatrix} \tag{12}$$

When equations (8) to (11), as set out above, are arranged in order by means of matrix M, a determinant represented by the following equation (13) is obtained.

$$\begin{pmatrix} S_{00} \\ S_{01} \\ S_{10} \\ S_{11} \end{pmatrix} = M \cdot \begin{pmatrix} D_{00} \\ D_{01} \\ D_{10} \\ D_{11} \end{pmatrix} \tag{13}$$

The following equation (14) is obtained from equation (13), as set out above, and each coordinate of Dij is determined from a determinant represented by equation (14). In equation (14), inv(M) is an inverse matrix of matrix M.

$$\begin{pmatrix} D_{00} \\ D_{01} \\ D_{10} \\ D_{11} \end{pmatrix} = inv(M) \cdot \begin{pmatrix} S_{00} \\ S_{01} \\ S_{10} \\ S_{11} \end{pmatrix} \tag{14}$$

The Dij obtained in these cases is the control point coordinate used in the coordinate conversion in the invention, and, when Dij is applied to equation (3), a coordinate conversion can be realized from a coordinate after deformation to a coordinate before deformation.

In order to simplify further the processing, it can be assumed that a relative positional relationship between Pij and Sij is equal to a relative positional relationship between Sij and Dij. In these circumstances, Dij can be determined by the following equation (15). However, since, in these cases, an error in calculation is generated, in order to avoid a deterioration in the precision of the deformation processing, it is preferable to use the operation described above.

$$\begin{aligned} D_{ij} &= S_{ij} + (S_{ij} - P_{ij}) \\ &= S_{ij} \times 2 - P_{ij} \end{aligned} \tag{15}$$

Based on the above principle, in the invention, control point coordinate information representing each of the coordinates of multiple control points corresponding to positions of multiple reference marks is derived by a deriving component on the basis of the positional information; a coordinate point of an image before deformation, corresponding to an arbitrary point in the image after deformation, is operated by an operating component on the basis of the control point coordinate information; and image information representing an image after deformation is generated as post-conversion image information by applying image information of the arbitrary point, image information representing the image as it existed before deformation of the coordinate point.

As described above, according to the image forming apparatus of the invention, on the basis of the positional information, control point coordinate information is derived, showing each of the coordinates of multiple control points corresponding to positions of multiple reference marks; on the basis of the control point coordinate information, the coordinate point of an image before deformation, corresponding to an arbitrary point in an image after deformation, is operated; image information representing an image as it exists after deformation is generated by applying as image information of the arbitrary point image information representing the image as it existed before deformation of the coordinate point operated; and, since an image after deformation is formed on the recording medium as post-conversion image information, displacement of a forming position of an image can be corrected with a high degree of accuracy, even when the recording medium is strained into an arbitrary shape.

In addition to the FFD method described above, any image deformation technique, in which the coordinate point of an image before deformation, corresponding to an arbitrary point in the image after deformation, is operated on the basis of the control point coordinate information, can be applied to the operation of the coordinate point by the operating component of the invention.

It is also preferable that the operating component of the invention uses the FFD method to operate the coordinate point of the image before deformation. In other words, when v is set to a fixed value, it has been discovered that equation (1) by the FFD method is a linear function on the basis of u. Accordingly, when v is determined, an initial value (starting point) and increments (increments corresponding to increments of u) can both be easily determined. Use of the initial value and the increments enables subsequent operations to be simple adding operations, and operation processing can be speeded up.

An image forming method of a second aspect of the invention includes: obtaining positional information representing positions of each of a plurality of reference marks provided in advance in a recording medium; on the basis of the positional information, virtually dividing forming area of an image on the forming medium into a plurality of geometrical areas with angular outlines; in each divided area converting image data representing the image so that the image is matched to a corresponding image for a corresponding divided area without deformation; and on the basis of the converted image data, forming the image on the recording medium.

Since the image forming method of the second aspect of the invention acts in a similar way to the first aspect of the invention, in the same way as in the first aspect of the invention, displacement of a forming position of an image can be corrected with a high degree of accuracy, even when the recording medium is strained into an arbitrary shape.

Further, the invention provides for the conversion of image information, by obtaining positional information representing the positions of each of multiple reference marks provided in advance in a recording medium; by, on the basis of the positional information, deriving control point coordinate information representing each of the coordinates of multiple control points corresponding to positions of multiple reference marks; by, on the basis of the control point coordinate information, operating a coordinate point of an image before deformation corresponding to an arbitrary point in the image after deformation; by generating image information representing an image after deformation by applying, as image information of the arbitrary point, image information representing the image before deformation of the coordinate point operated; and by generating, as post-transformation image information, image information representing an image as it exists after deformation.

Since the image forming method of the second aspect of the invention acts in a similar way to that of the first aspect of the invention, similarly to the first aspect of the invention, displacement of a forming position of an image can be corrected with a high degree of accuracy, even when the recording medium is strained into an arbitrary shape.

On the other hand, in order to achieve the objective described above, a storage medium of a third aspect of the invention is provided, including a computer program capable of causing a computer to execute steps comprises: obtaining positional information representing positions of each of a plurality of reference marks provided in advance in a recording medium; on the basis of the positional information, virtually dividing forming area of an image on the recording medium into a plurality of geometrical areas with angular outlines; in each divided area converting image data representing the image so that the image is matched to a corresponding image for a corresponding divided area without deformation; and on the basis of the converted image data, forming the image on the recording medium.

By means of the storage medium of the third aspect of the invention positional information can be obtained representing each of the positions of multiple reference marks provided in advance in a recording medium in which an image is formed.

Further, the reference marks mentioned above can include marks, such as holes, grooves, signs, characters and figures, representing reference positions. Moreover, it is possible to obtain the positional information mentioned above by means of sensors, such as photographic devices which search by photographing positions of the reference marks mentioned above, or by photo interrupters which use light to search for the positions of reference marks. In addition, PWB and FPD boards are included in the recording medium mentioned above.

In the present invention, based on the positional information, the forming areas of images in the recording medium are virtually divided into multiple divided areas with angular outlines; areas which have been designed are designated to correspond to each of the divided areas; and further, points within the areas designed are designated, corresponding to multiple points within the divided areas, and corresponding in turn to each of the divided areas; and, from the image data representing points within the areas which have been designed, image data is obtained representing points within the divided area.

Thus, according to the third aspect of the invention, positional information is obtained representing the positions of each of multiple reference marks provided in advance in the recording medium; on the basis of the positional information, forming areas of images in the recording medium are virtually divided into geometrical areas with angular outlines; areas which have been designed are designated, corresponding to each of the divided areas; points within the areas designed are designated, corresponding to multiple points within the divided areas; and, because image data of points within the divided areas is obtained from image data representing points within the areas designed, it is possible to correct with a high degree of accuracy any displacements of the forming positions of images, even when the recording medium is strained into an arbitrary shape.

According to the invention, positional information is obtained representing the positions of each of multiple reference marks provided in advance in a recording medium; on the basis of the positional information, forming areas of the images in the recording medium are virtually divided into multiple geometrical areas with angular outlines; in each divided area image information is converted so that, on the assumption that there is no strain in the recording medium, images to be formed are matched with images formed in divided areas; and because images are formed on the recording medium on the basis of the information after conversion, even in circumstances where the recording medium is strained into an arbitrary shape, there is an advantage that displacements of forming positions of images can be corrected with a high degree of accuracy.

BRIEF DESCRIPTION OF THE DRAWINGS

FIG. 6A is a plan view showing a state of a locating hole of a PWB in a case where strain is not generated; and FIG. 6B is a plan view showing the state of the locating hole of a PWB after strain has been generated.

DETAILED DESCRIPTION OF THE INVENTION (First Embodiment)

Figure 1:
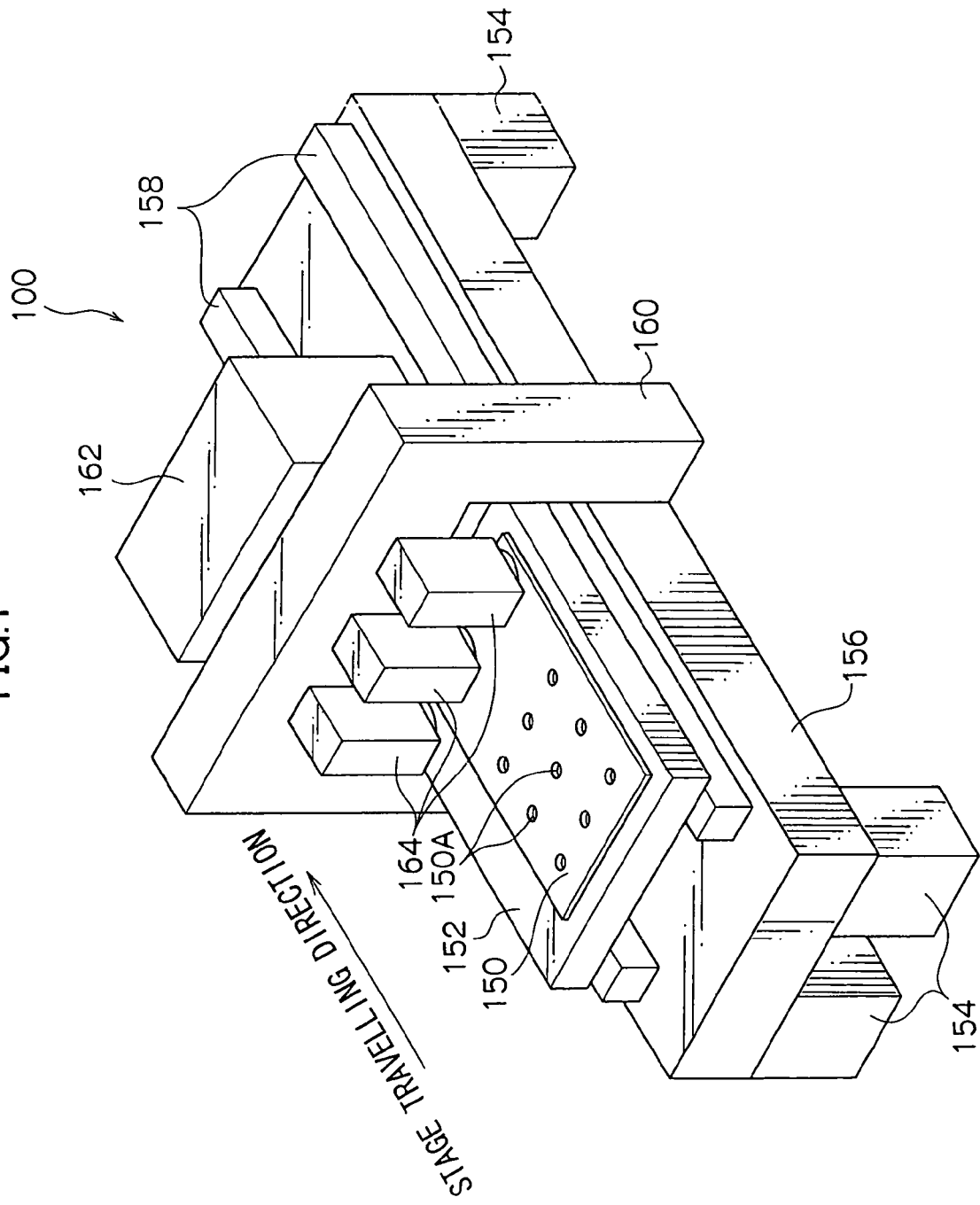
FIG. 1 is a perspective view showing an outward appearance of an image forming apparatus according to embodiments of the present invention.

A first embodiment of the present invention will be described below. FIG. 1 shows a flatbed type of image forming apparatus 100 according to the first embodiment.

The image forming apparatus 100 includes a thick plate-like installation bench 156 supported by four leg portions 154, and by way of two guides 158 extending along a stage traveling direction to a plate-like stage 152. Stage 152 has a function of absorbing and holding on a surface thereof a PWB (Printed Wiring Board) 150.

A longitudinal direction of stage 152 is set to a stage traveling direction, and the stage is guided and reciprocably (scannably) supported by guides 158. A driving apparatus for driving stage 152 along guides 158 is provided in image forming apparatus 100, and the driving apparatus is controlled by the stage control unit 112 mentioned below (see FIG. 5), so that stage 152 acquires a traveling speed (scanning speed) corresponding to a desired degree of magnification in a scanning direction.

In a central portion of installation bench 156, a U-shaped gate 160 is provided so as to straddle the traveling path of stage 152. Each end portion of the U-shaped gate 160 is fixed to each side face of installation bench 156. A forming head 162 is provided on a side opposite from gate 160, and multiple cameras 164 (three cameras in the embodiment) are also provided on this other side. The multiple cameras 164 detect front and back ends of PWB 150, and positions of multiple locating holes 150A (12 locating holes in the embodiment) which have been previously provided in PWB 150 and, as seen from a plan view, have a circular configuration.

Figure 2:
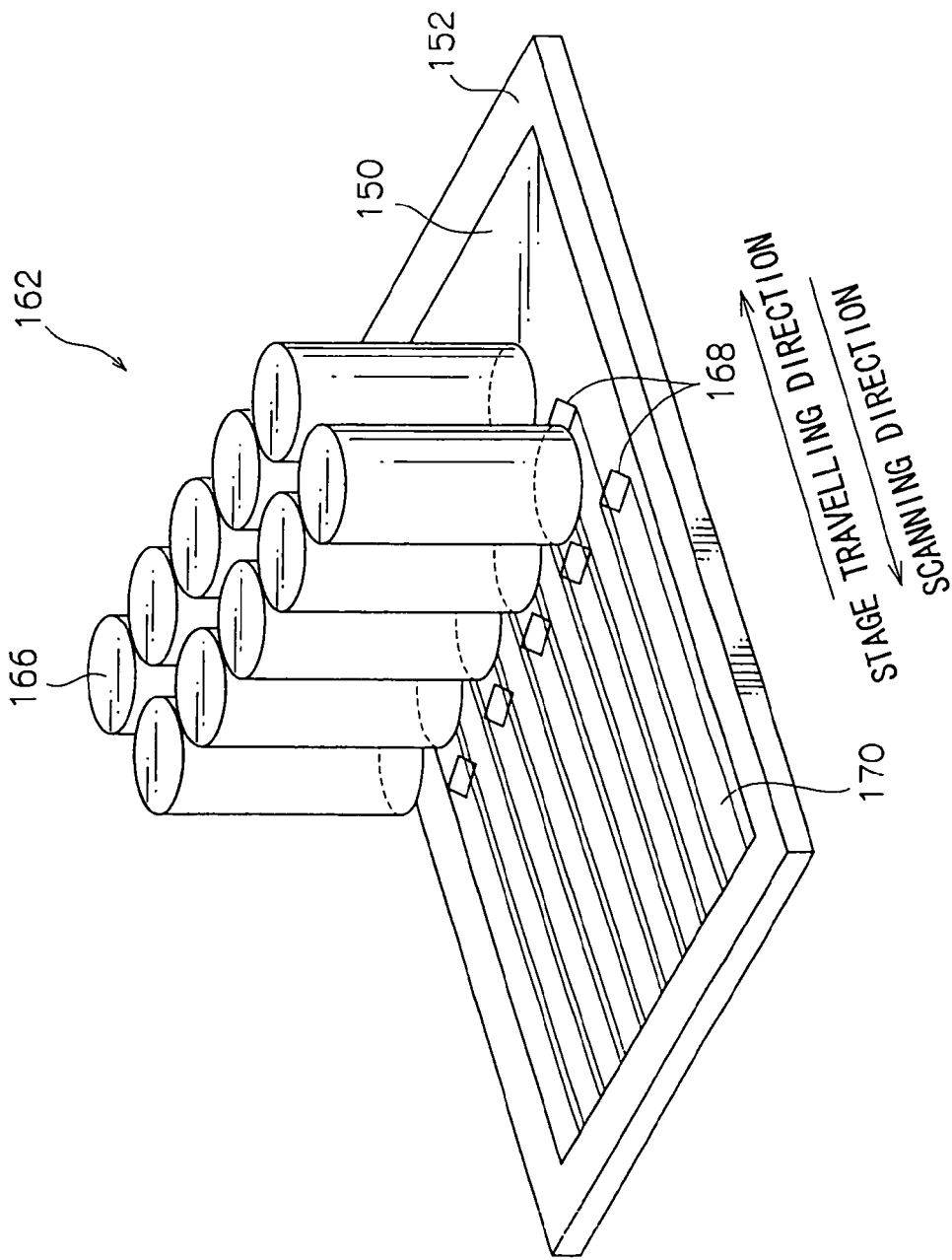
FIG. 2 is a perspective view showing a configuration of a forming head of the image forming apparatus according to embodiments of the invention.
Figure 3A:
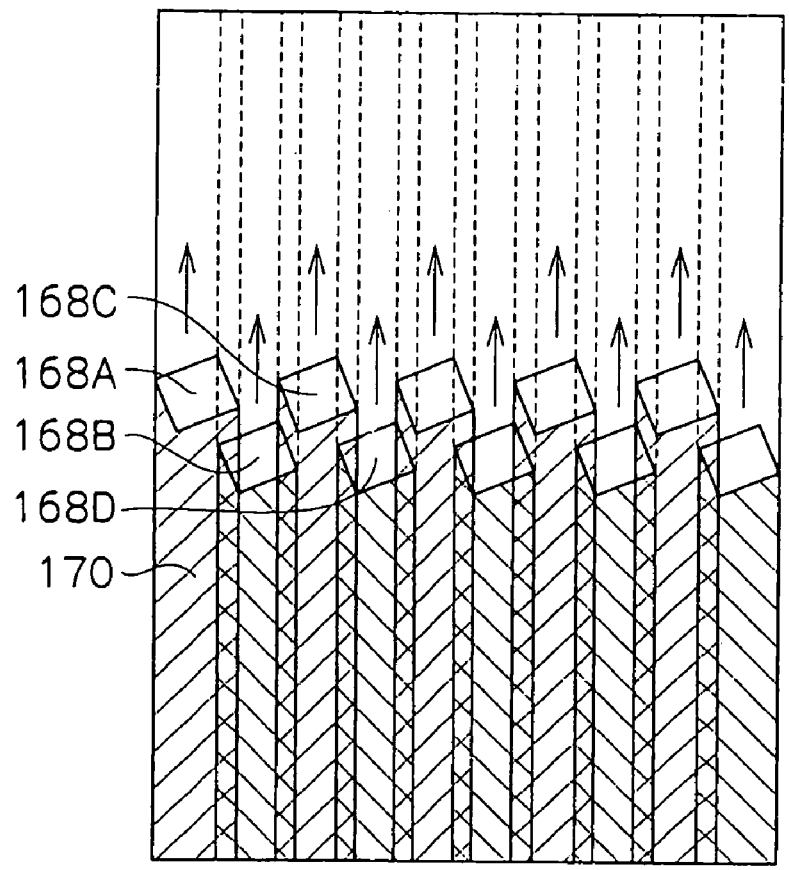
FIG. 3A is a plan view showing an exposed region formed on a PWB.
Figure 3B:
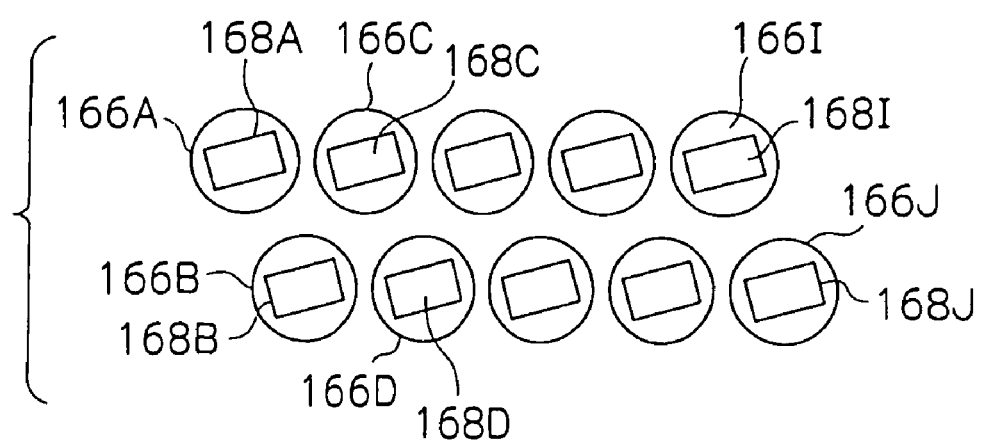
FIG. 3B shows an array of an exposure area formed by each exposure head.

The forming head 162 includes multiple forming element units 166 arrayed in a substantial matrix shape of m rows and n columns (for example, two rows and five columns), as shown in FIGS. 2 and 3B.

As shown in FIG. 2, an image area which is an area exposed by forming element units 166 has a rectangular shape whose shorter side is along the scanning direction, and the image area is inclined in a scanning direction at a predetermined inclination angle θ. As stage 152 travels, strip-shaped exposed regions 170 are formed in each forming element unit 166 in PWB 150. As shown in FIG. 2, the scanning direction is the opposite of the stage traveling direction.

As shown in FIGS. 3A and 3B, each forming element unit 166 of each row arrayed in line is arranged while being shifted by a predetermined interval in an array direction (multiplication by natural numbers of a long side of an image area, double in the embodiment) so that strip-shaped exposed regions 170 partially overlap an adjacent exposed region 170. Therefore, for example, a part that can not be exposed between an image region 168A located at the extreme left hand side of the first row and an image region 168C located on the right side of the image region 168A is exposed in image region 168B located at the extreme left hand side of the second row. Similarly, a part that can not be exposed between image region 168B and an image region 168D located on the right side of image region 168B is exposed in image region 168C.

In each of the forming element units 166, a digital micromirror device (DMD) which is a spatial light modulator performs on/off control of the incident light beam in a dot unit, a binarized dot pattern (black and white) is exposed in the PWB 150 and a density of one pixel is expressed by these multiple dot patterns.

Figure 4:
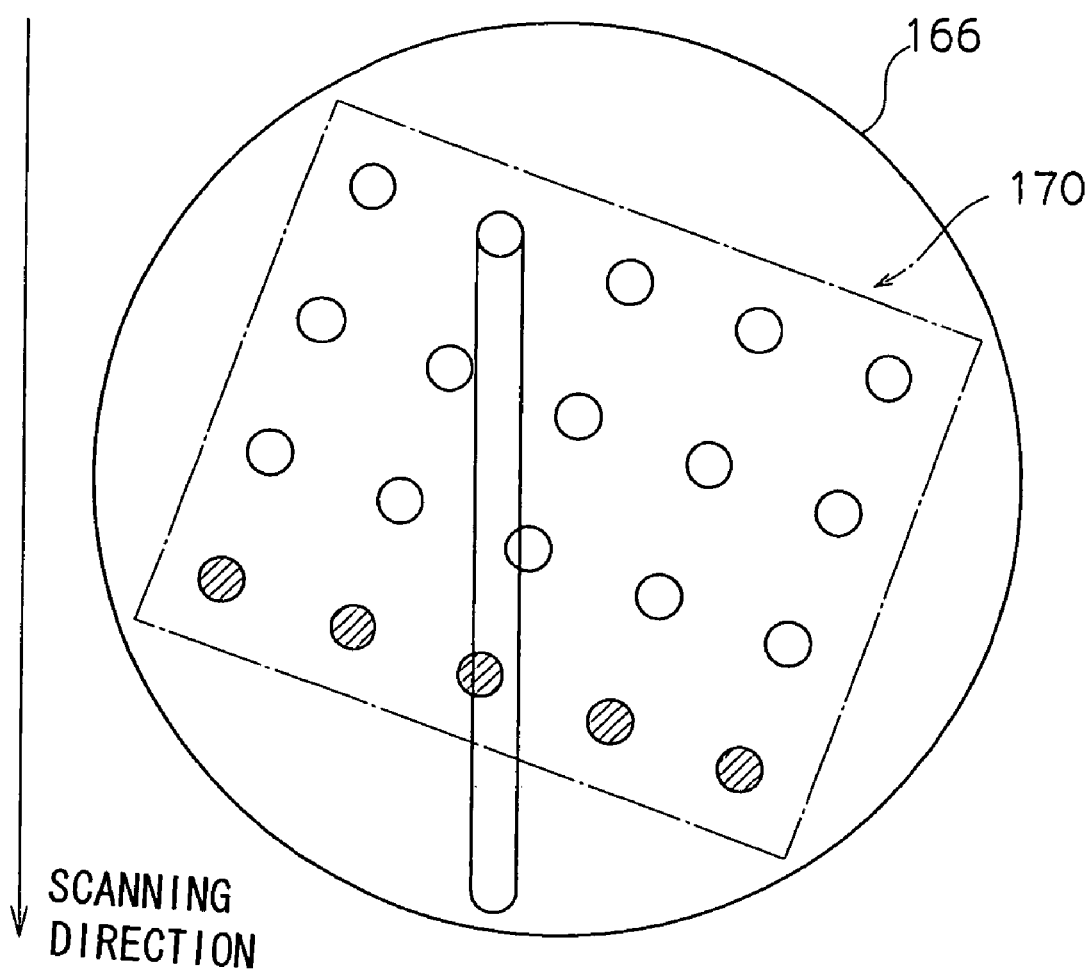
FIG. 4 is a plan view showing a dot array state of a forming element unit.

As shown in FIG. 4, a strip-shaped exposed region 170 (one forming element unit 166) is formed by 20 two-dimensionally arrayed dots (four by five).

Since a two-dimensionally arrayed dot pattern is inclined in a scanning direction, each of the dots arranged in the scanning direction is formed to pass between dots arranged in a direction which intersects the scanning direction, and high resolution can be achieved.

Sometimes due to variations in adjustments of the inclination angle, a dot is not utilized. For example, in FIG. 4, a hatched dot is not utilized, and a DMD corresponding to the hatched dot is always in an off state.

Image forming apparatus 100 according to the invention is one whose forming subject is a wiring pattern of each layer of PWB 150 formed as a multi-layered printed wiring board. The overall manufacturing process of PWB 150, in which image forming apparatus 100 is used, will be described briefly below.

A photosensitive material is applied on a surface of PWB 150, and PWB 150 is placed in a predetermined position on stage 152 in image forming apparatus 100 (as shown in FIG. 1, the substantially central position of stage 152 in the embodiment). PWB 150 is thus absorbed and held on the surface.

An image (latent image) of the wiring pattern is formed on an upper surface of PWB 150 in such a manner that image forming apparatus 100 performs scanning exposure to the upper surface of PWB 150 on the basis of image data representing the wiring pattern.

Development (removal of regions which have not been exposed by image forming apparatus 100) and etching are performed on PWB 150 by the predetermined apparatus. In this way, an individual layer can be formed on a multi-layered printed wiring board.

A board forming a second layer is laminated onto the surface of the layer on which the wiring pattern has been formed. Lamination is carried out by means of a pressing process performed with a press hot plate.

The processes described above (application of the photosensitive material, scanning exposure of the wiring pattern by image forming apparatus 100, development, etching, and lamination of board) are then repeated to form the necessary number of layers, and the final PWB 150 is completed by means of a predetermined finishing process after etching of the final layer (surface layer) has been completed.

As described above, multiple locating holes 150A (twelve in this embodiment) are made in the predetermined positions of PWB 150. In these positions, displacement from a predetermined position in an arbitrary direction is often caused by the expansion and contraction of PWB 150 generated in the course of the pressing process.

Figure 5:
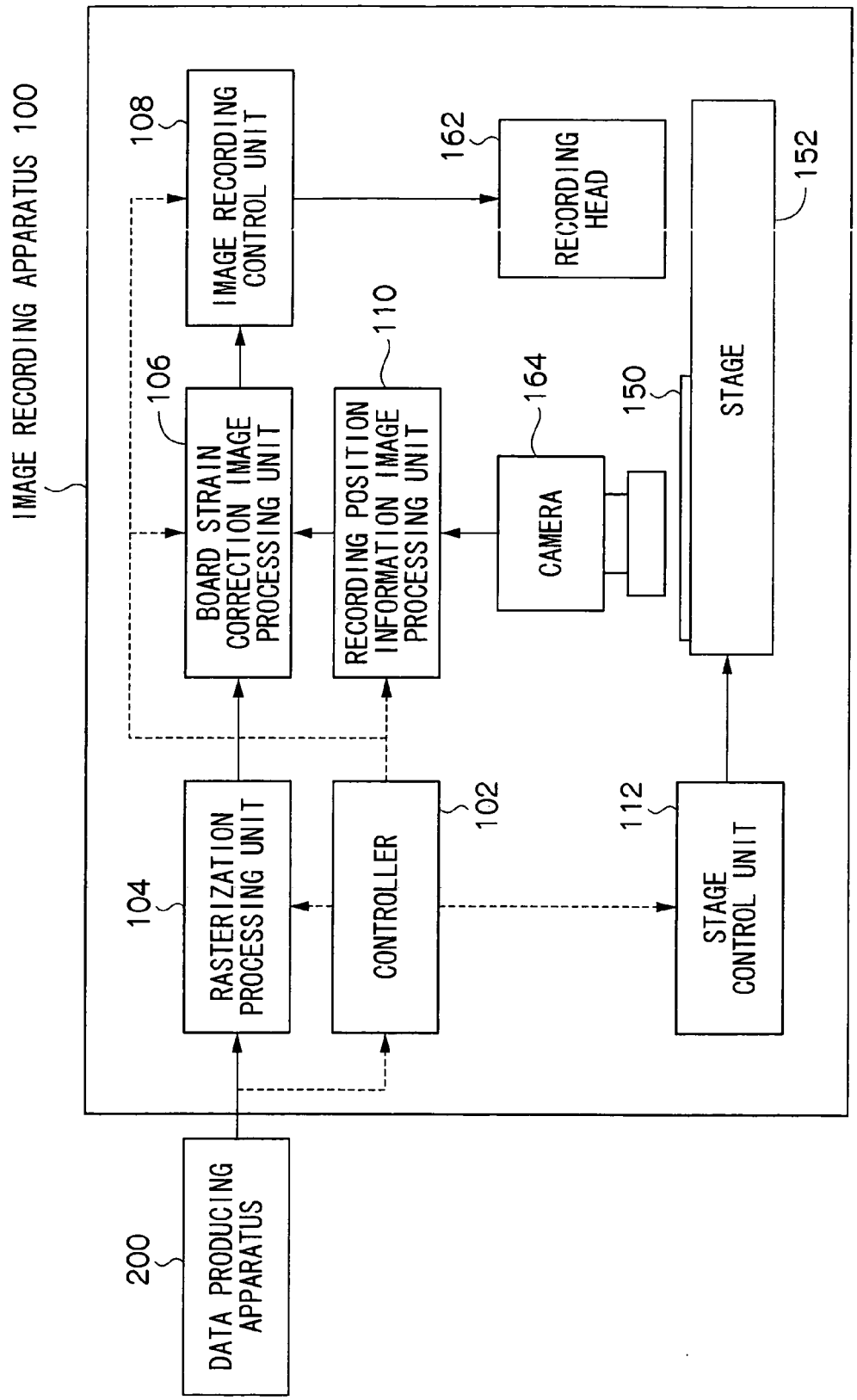
FIG. 5 is a functional block diagram for performing exposure control on a PWB in the image forming apparatus according to embodiments of the invention.

Next, an operation of image forming apparatus 100 during the scanning exposure will be described in detail with reference to FIG. 5. FIG. 5 is a functional block diagram illustrating control of exposure to PWB 150 in image forming apparatus 100.

Vector data is inputted into a rasterization processing unit 104. The vector data indicates the wiring pattern to be exposed and formed in a PWB 150, which has been produced by a data producing apparatus 200 containing a CAM (Computer Aided Manufacturing) station. In the rasterization processing unit 104, vector data is converted into raster data (bit map data) and outputted to a board strain correction image processing unit 106.

The vector data is also inputted from data producing apparatus 200 to a controller 102 which controls the operation of the entire image forming apparatus 100. In controller 102, on the basis of the vector data, control for moving stage 152 at a traveling speed (scanning speed) corresponding to the desired multiplication in the scanning direction is carried out, on behalf of stage control unit 112, by a driving device which moves stage 152 along guides 158. Consequently, PWB 150 placed on stage 152, in which wiring pattern 150 has not yet been exposed, starts to travel from the bottom position on the downstream side (position in FIG. 1) in a stage traveling direction.

Image data is sequentially inputted to a forming position information image processing unit 110. The image data represents an image of PWB 150 taken by multiple cameras 164 (three cameras in the embodiment). In forming position information image processing unit 110, positions of locating holes 150A in PWB 150 placed on stage 152 are detected on the basis of the image data, and positional information representing the positions of locating holes 150A (corresponding to "positional information" of the invention) is obtained and inputted to board strain correction image processing unit 106.

Locating holes 150A of PWB 150 can be detected by pattern matching of images represented by image data inputted from a camera 164 with images which have been obtained by shooting with a camera for the standard PWB 150 and which have not yet been subjected to the pressing process mentioned above, images represented by image data registered in a memory included in forming position information image processing unit 110. It is possible to apply also a detection method, in which information representing the positions of locating holes 150A in the standard PWB 150 is stored in advance in the memory, and circular images, which are of the same shape as locating holes 150A, are extracted from the image data corresponding to the region in a predetermined range, including positions represented by information representing the positions of locating holes 150A.

Due to strain in an arbitrary direction of PWB 150 caused by the pressing process, the positions of locating holes 150A obtained in the way described above (by way of example, see FIG. 6B) are often displaced in an arbitrary direction from a position in which strain is not generated (by way of example, see FIG. 6A).

For a PWB 150 in which strain in an arbitrary direction is generated, when a wiring pattern of each layer is formed by using directly the raster data obtained by the rasterization processing unit 104, in the resultant PWB 150 positional displacement is generated in a relative position of the wiring pattern of each layer.

Figure 7:
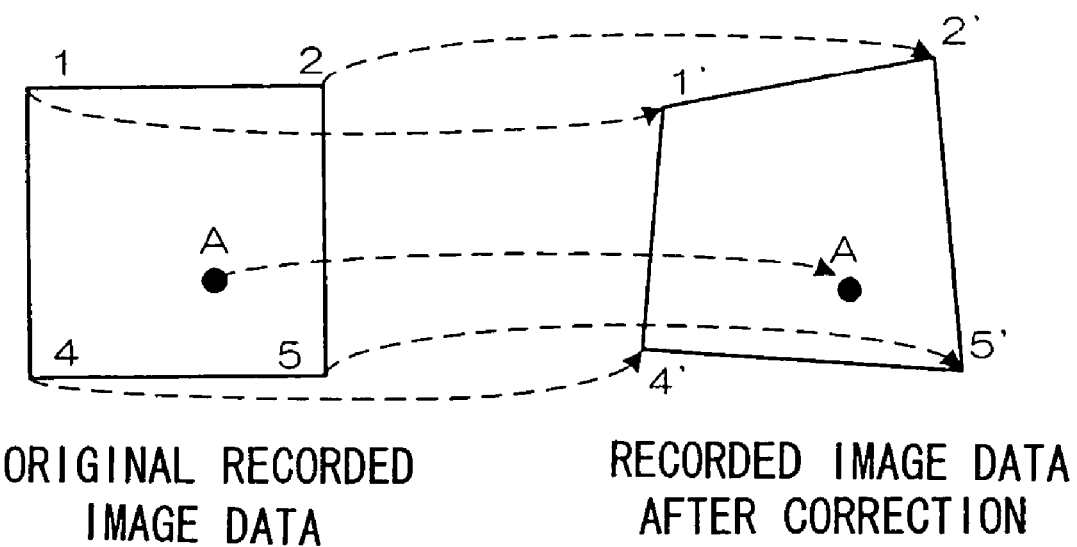
FIG. 7 is a schematic illustration of a state of transformation from a rectangle including vertices 1, 2, 4, and 5 in FIG. 6A into a quadrilateral in FIG. 6B corresponding to a rectangle and including vertices 1', 2', 4', and 5'.

Therefore, in the board strain correction image processing unit 106, as shown in FIG. 6B by way of example, the forming area of a wiring pattern in a PWB 150 is virtually divided into multiple quadrilateral areas on the basis of positional information inputted from forming position information image processing unit 110 representing the actual positions of locating holes 150A. In each divided area, the raster data is converted and, when it is assumed that there is no strain on PWB 150, the wiring pattern formed is matched to the wiring pattern formed in the corresponding divided area (see FIG. 6A). FIG. 7 schematically shows a state in which a rectangle including vertices 1, 2, 4, and 5 in FIG. 6A is converted into a quadrilateral corresponding to a rectangle in FIG. 6B and including vertices 1', 2', 4', and 5'.

The procedure for converting raster data, as performed in board strain correction image processing unit 106 according to the embodiment, will be described in detail with reference to FIG. 8. In this case, in order to avoid confusion, among the multiple divided areas obtained on the basis of the positional information representing the positions of each of locating holes 150A, only one divided area (the quadrilateral area in FIG. 8 including vertices A, B, C, and D) will be covered.

Figure 8:
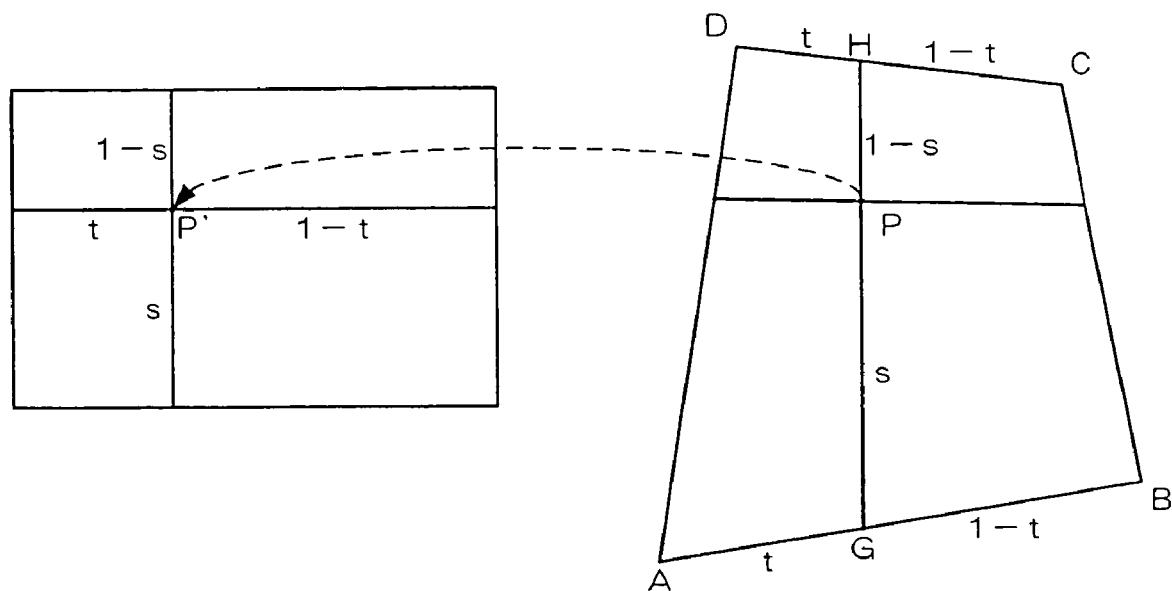
FIG. 8 is an explanatory view showing a raster data transformation process performed on a board strain correction image processing unit according to the first embodiment of the invention.

As shown in FIG. 8, a dividing point between points A and B, t:1−t, is set to point G, a dividing point between point D and point C, t:1−t, is set to point H, a dividing point between point G and point H, s:1−s, is set to point P, and s and t are determined from the coordinate of point P.

Namely, the following equation (16) can be obtained on the basis of the above assumption.

$$\vec{G}=t(\vec{B}-\vec{A})+\vec{A}, \vec{H}=t(\vec{C}-\vec{D})+\vec{D}$$

$$\vec{P}=s(\vec{H}-\vec{G})+\vec{G}=st(\vec{C}-\vec{D}-\vec{B}+\vec{A})+s(\vec{D}-\vec{a})+t(\vec{B}-\vec{A})+\vec{A} \quad (16)$$

The following simultaneous equations are solved by equation (16), where a, b, c, d, f, g, h, and e are constants in the simultaneous equations.

$$ast+bs+ct=d$$

$$fst+gs+ht=e$$

t is determined from the following equation.

$$(ah-cf)t^2+(df-cg+bh-ae)t+(dg-be)=0$$

Then, s is determined by substituting t in the following equation.

$$s=(d-ct)/(at+b)$$

A pixel value of point P' of the original image corresponding to s and t, as determined by the above operations, is substituted for the pixel value of point P.

Then, conversion of the raster data is completed in the quadrilateral areas by executing the substitution of the pixel value of all pixels in the quadrilaterals, including vertices A, B, C, and D.

In the image forming control unit 108, on/off data of each forming element unit 166, which becomes the final image data, is generated by the raster data corresponding to all the divided areas in the wiring pattern area of PWB 150 which have been converted in board strain correction image processing unit 106. The DMD of each forming element unit 166 of a forming head 162 is controlled by the use of on/off data in synchronization with the travel of stage 152, and the image forming of the wiring pattern is executed. Thus, a wiring pattern image is exposed on PWB 150. The activation of rasterization processing unit 104, board strain correction image processing unit 106, image forming control unit 108, and forming position information image processing unit 110 is controlled by controller 102.

As described above, in the embodiment, positional information is obtained representing positions of each of the multiple locating holes 150A made in advance in PWB 150; on the basis of the positional information, forming areas of wiring pattern images in PWB 150 are virtually divided into multiple quadrilateral areas; in each divided area, raster data representing images are converted, so that, when it is assumed that there is no strain on PWB 150, a wiring pattern image formed is matched to an image formed in a corresponding divided area; and images are formed on PWB 150 on the basis of the raster data as it exists after conversion. Therefore, displacement of a forming position of an image can be corrected with a high degree of accuracy even in a case where PWB 150 is strained in an arbitrary direction.

Further, in the embodiment, locating holes 150A which have previously been made in PWB 150 for positioning during image forming are used as reference marks of the invention, so that an additional step is not required in order to provide the reference mark, and the invention can be simply realized at low cost.

Although the forming element unit 166 including DMD as the spatial light modulator was described in the embodiment, in addition to a reflection type spatial light modulator such as a DMD, a transmission type spatial light modulator (LCD) can also be used. For example, a MEMS (Micro Electro Mechanical Systems) type spatial light modulator, an optical element (PLZT element) modulating transmitted light by electro-optic effects, and a liquid crystal shutter array such as a liquid crystal optical shutter (FLC) can be also used. A micro system in which a micro-size sensor, a micro-size actuator, and a micro-size control circuit are made and integrated by micromachining technology based on an IC manufacturing process is generally called MEMS, and the MEMS-type spatial light modulator means one which is driven by an electro-mechanical operation utilizing electrostatic force. Further, multiple Grating Light Valves (GLV) which are arranged and formed two-dimensionally can also be used. In the configuration using the reflection type spatial light modulator (GLV) or a transmission type spatial light modulator (LCD), in addition to the laser, other lamps can be also used as the light source.

Further, a fiber array light source including multiple multiplexing laser light sources; a fiber array light source in which fiber light sources, including one optical fiber emitting a laser beam incident from a single semiconductor laser having one light emitting point, are arrayed; and a light source in which multiple light-emitting points are two-dimensionally arrayed (for example, an LD array or an organic EL array) can all be applied as the light source in the embodiment.

In addition to the exposure of a Dry Film Resist (DFR) in the manufacturing process of the printed wiring board described above, image forming apparatus 100 of the embodiment can be preferably used for applications such as the formation of a color filter in the manufacturing process of a liquid crystal display device (LCD), the exposure of a DFR in the manufacturing process of a thin-film transistor (TFT), and the exposure of a DFR in the manufacturing process of a plasma display panel (PDP).

The technique of converting the raster data is not limited to the technique described in the embodiment. Techniques, such as affine transformation, and collinear transformation, can be also applied as the technique for converting the raster data.

Figure 9:
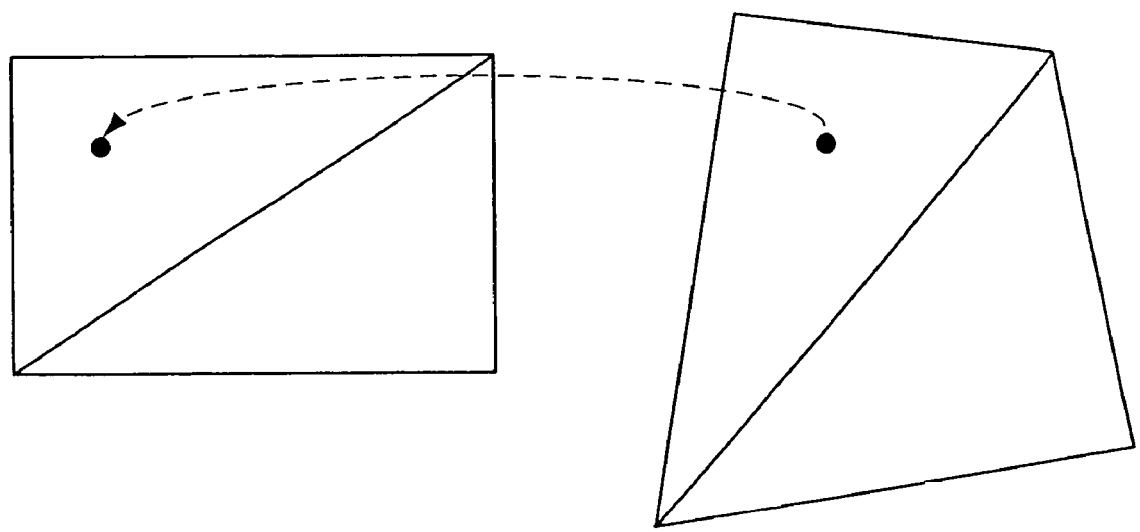
FIG. 9 is an explanatory view in a case where affine transformation is applied to a transformation technique of raster data.

In the technique of affine transformation, as in an example shown in FIG. 9, each divided area (quadrilateral area) in the embodiment is divided into two triangular areas to perform the affine transformation. Affine transformation is expressed by the following equation.

$$X=ax+by+c$$

$$Y=dx+ey+f$$

a to f can be determined by solving six simultaneous equations obtained from the three vertices of the above triangular area.

On the other hand, collinear transformation is expressed by the following equation:

$$X=axy+bx+cy+d$$

$$Y=exy+fx+gy+h$$

a to h can be determined by solving eight simultaneous equations obtained from the four vertices of each divided area (quadrilateral area) in the embodiment.

Since affine transformation and collinear transformation are well-known art, a more detailed description will be omitted here. In cases where these converting techniques are applied, the same effects as in the embodiment can be obtained.

Although a case has been described in the embodiment, in which locating holes 150A made in advance in PWB 150 are used as reference marks of the invention, the invention is not limited to such a case. For example, a mark such as a locating mark formed during forming of the previous wiring pattern can be also used as a reference mark of the invention. In such a case, the same effects as in the embodiment can also be obtained.

The configuration of image forming apparatus 100 described in the embodiment is no more than one example (see FIGS. 1 to 5), and the configuration can be appropriately modified within the scope of the invention.

Further, the flow of processing during the scanning exposure of image forming apparatus 100, as described in the embodiment, is no more than one example, and the configuration can be appropriately modified within the scope of the invention.

Moreover, processing during scanning exposure of the image forming apparatus 100, as described in the embodiment of the invention (see FIG. 5), can be carried out with hardware, but this processing can also be undertaken by means of software. In circumstances where software is used to perform the processing, the program which makes up the software can be installed in the storage medium of a computer in which specialist hardware has been fitted (personal computers of the type in which hardware and programs are incorporated, and the like), or it can be installed in the storage medium of an ordinary personal computer in which various kinds of programs can be installed, and which can thus perform various functions.

The storage medium can invoke, for the reader installed in the hardware resources of the computer, a state of transition in magnetic, optical or electrical energy, in accordance with the descriptive contents of the program; and, in the shape of a signal responding to this, the storage medium can transmit the descriptive contents of the program to the reader. For example, the program may be made up of a package media composed of a magnetic disk, an optical disk, a magneto-optic disc or a semi-conductor memory, in which the program is formed, and which is distributed, separately from the computer, in order to provide a user with the program. The program can also be offered to a user in a state in which it has already been incorporated into a computer, or incorporated into a ROM (read only memory) or a hard disk. Alternatively, the program making up the software may be offered to a user by means of a communications network such as telegraph or wireless.

(Second Embodiment)

An explanation follows of the second embodiment of the invention. The configuration of image forming apparatus 100 described in the second embodiment, and the configuration of exposed areas 170 of forming apparatus 100 are the same as in the first embodiment (see FIGS. 1 to 4), and a description will thus be omitted. Moreover, the overall manufacturing process of PWB 150 used in the image forming apparatus of the second embodiment is the same as in the first embodiment, and a description thereof will thus be omitted.

The functional block diagram for performing exposure control on PWB 150 in the image forming apparatus according to the second embodiment is to all intents and purposes the same as in the first embodiment, and the only difference concerns the use of board strain correction image processing unit 106.

Figure 10C:
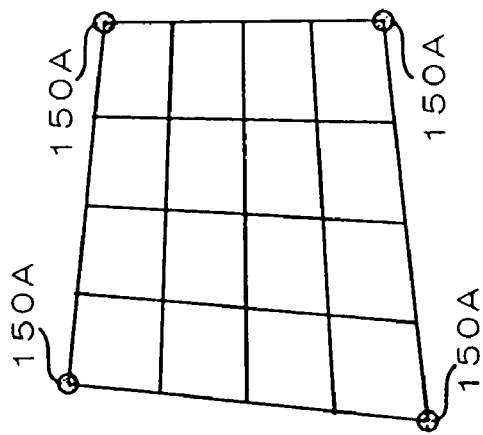
FIG. 10A to FIG. 10C are plan views for explaining a deformation state of an image indicating a wiring pattern expressed by raster data according to the second embodiment of the invention.
Figure 10B:
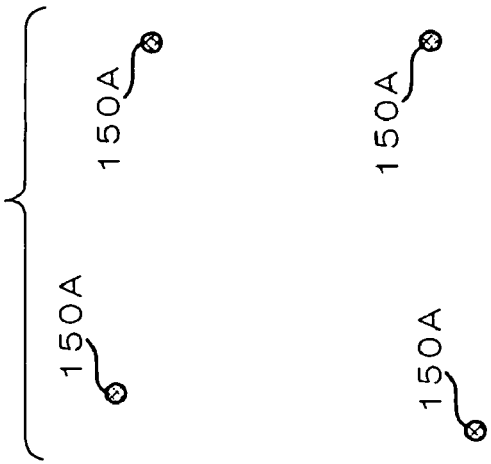
Figure 10A:
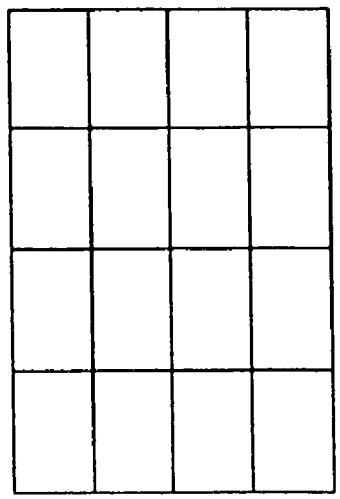

In board strain correction image processing unit 106 of the second embodiment, as shown in FIGS. 10A to 10C by way of example, based on the principle of image conversion of the invention as described above, on the basis of positional information showing the actual positions of locating holes 150A inputted from the forming position information image processing unit 110, an image showing a wiring pattern expressed by the raster data is deformed so as to correspond to the deformation of PWB 150.

Figure 11:
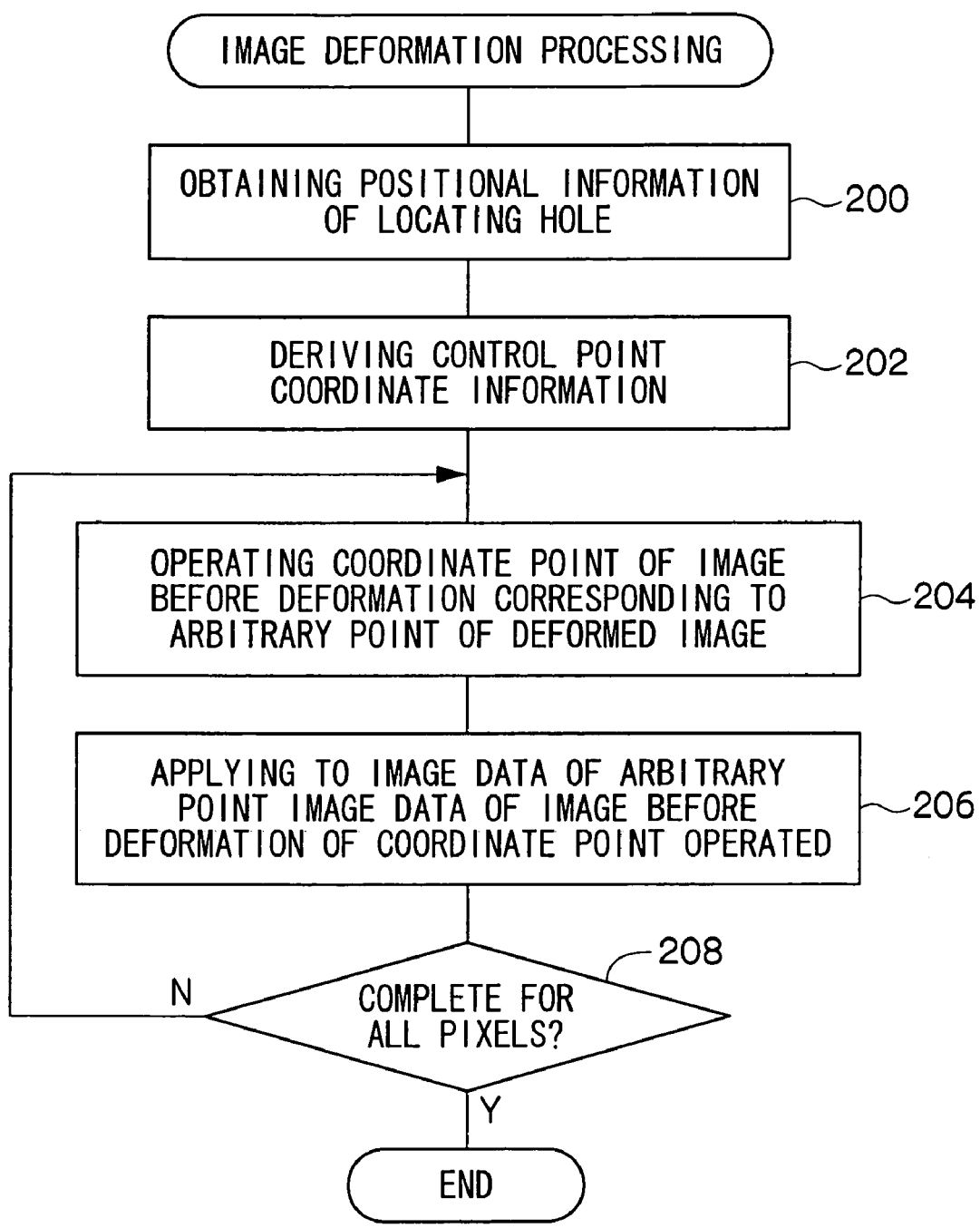
FIG. 11 is a flow chart showing processes of an image deformation processing program according to the second embodiment of the invention.

The procedure of converting raster data, performed in the board strain correction image-processing unit 106 according to the embodiment, will now be described in detail with reference to FIG. 11. FIG. 11 is a flow chart showing the flow of an image deformation-processing program at the time that the raster data is converted. Moreover, in order to avoid complications, an explanation will be focused entirely on one of the multiple divided areas obtained on the basis of positional information representing positions of positioning holes 150A (by way of example, quadrilateral areas in FIG. 6 formed with 1', 2', 4' and 5' as corner points thereof).

Figure 14:
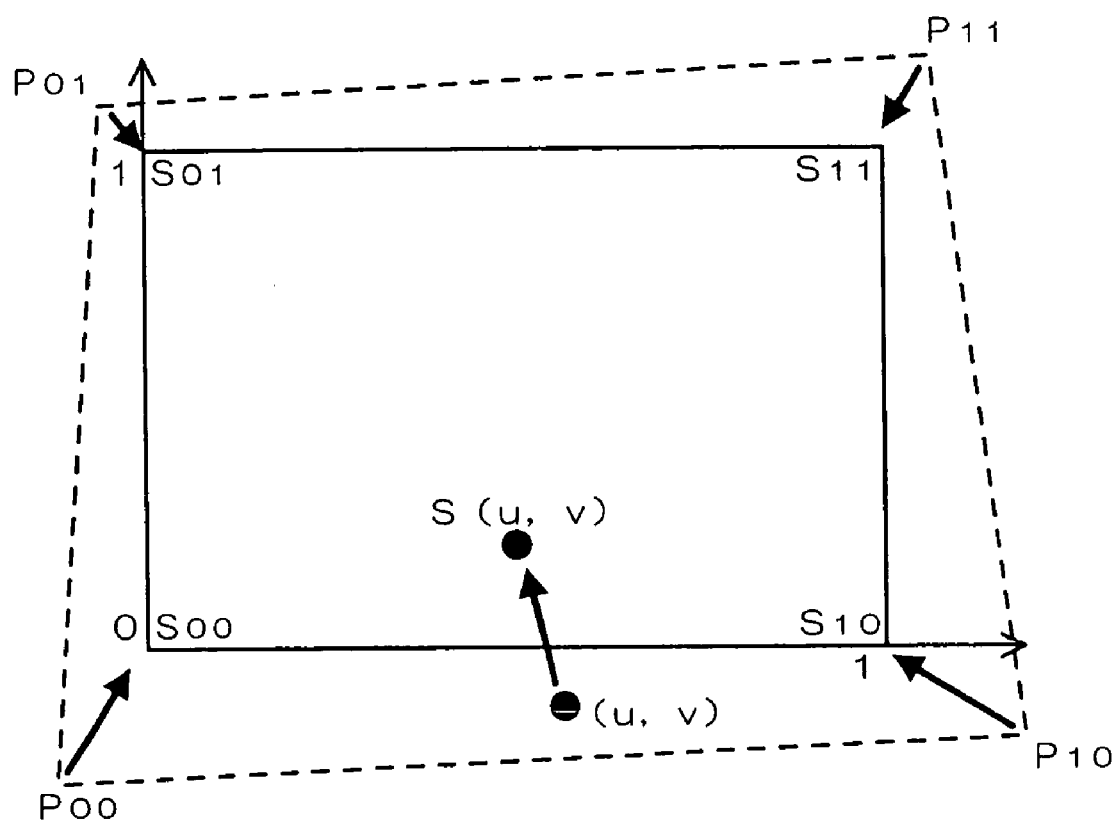
FIG. 14 is another view for explaining the principle of the invention.
Figure 15:
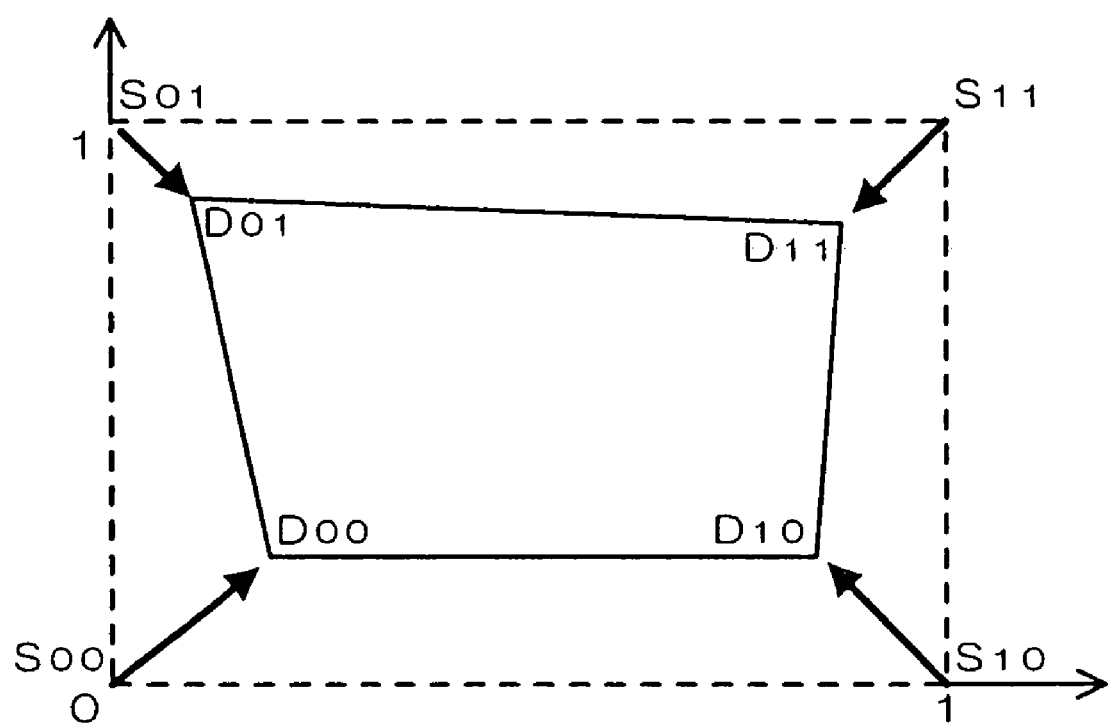
FIG. 15 is a further view for explaining the principle of the invention.

In Step 200, positional information inputted from forming position information image processing unit 110 is obtained. In Step 202, each coordinate point Dij that becomes a control point is derived from equation (14) by the application of coordinate positions of the four locating holes 150A indicated by the positional information relative to each position of point Pij obtained, as shown, for example, in FIG. 14.

In Step 204, the coordinate point S(u,v) of an image indicating a wiring pattern before deformation is calculated by means of equation (3) on the basis of each coordinate of point Dij derived in Step 202. The coordinate point S(u,v) of an image indicating a wiring pattern before deformation corresponds to arbitrary point (u,v) of an image indicating a wiring pattern after deformation. In the following Step 206, image data contained in the raster data of the coordinate point S(u,v) as calculated, is stored in a storage component as image data of arbitrary points (u,v).

In Step 208, it is decided whether or not Step 204 and Step 206 have been performed on all pixels of the wiring pattern after deformation. If Step 204 and Step 206 have not been performed on all pixels, the flow returns to Step 204 to perform again Steps 202 and 204, and the image deformation processing program is completed at the time when Steps 204 and 206 have been performed on all pixels.

Figure 12:
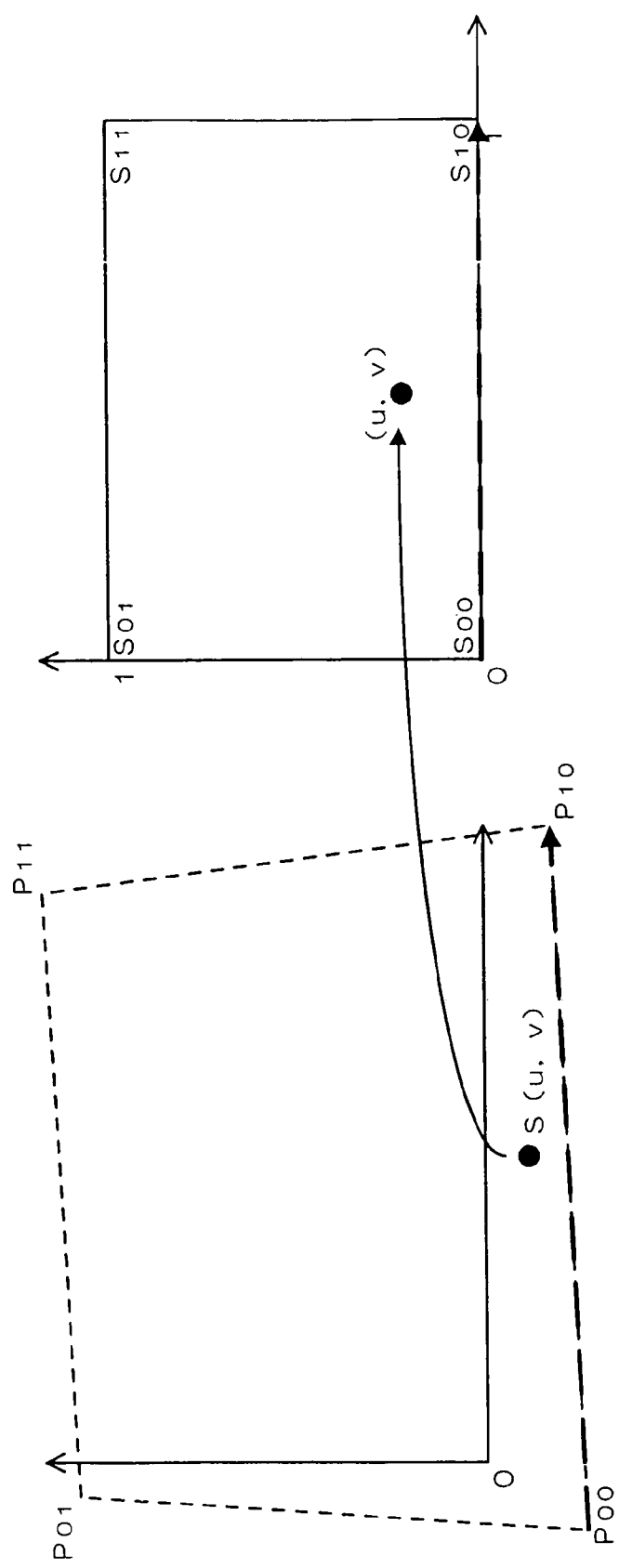
FIG. 12 is a plan view showing an example of a scan state in a coordinate system before and after image deformation executed by the image deformation processing program according to the second embodiment of the invention.
Figure 13:
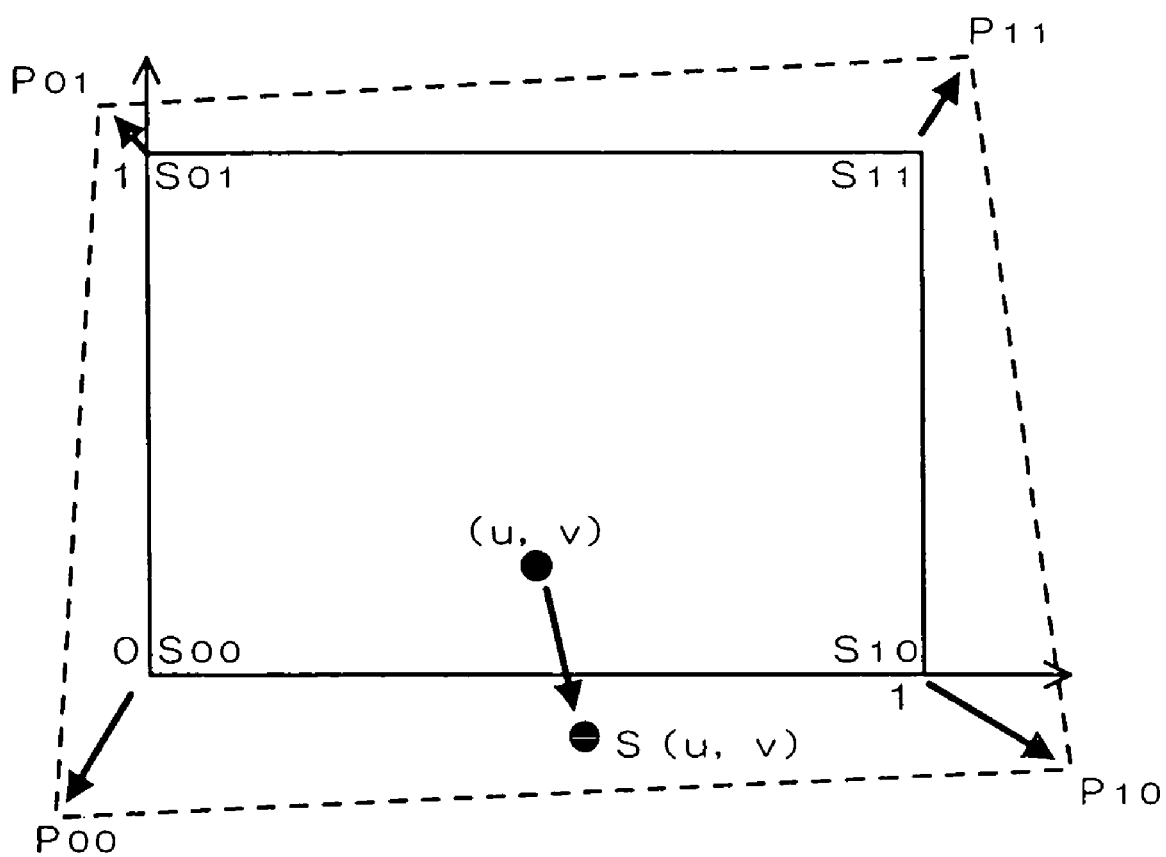
FIG. 13 is a view for explaining a principle of the invention.

During the execution of repeated processing in Steps 204 to 208, any point which has not been set for the processing is applied as an the arbitrary point in Step 204. During the repeated processing of Steps 204 to 208, v is fixed to 0 (zero), and u is gradually increased from 0 to 1, such that a locus, by way of an example, of a broken line arrow shown in FIG. 12 is scanned in both coordinate systems before and after deformation. The overall surface can be scanned by increasing v gradually in each individual scan of u. As a result, raster data can be obtained showing the wiring pattern image after deformation.

On the other hand, in image forming control unit 108 of the second embodiment, on/off data of each forming element unit 166, which becomes the final image data, is generated by raster data after deformation, obtained in board strain correction image processing unit 106. The DMD of each forming element unit 166 of forming head 162 is controlled by use of on/off data while synchronization with the travel of stage 152 is carried out. The image forming of the wiring pattern is thus executed. In this manner, the images indicating wiring pattern are exposed on PWB 150. The activation of rasterization processing unit 104, board strain correction image processing unit 106, image forming control unit 108, and forming position information image processing unit 110 is controlled by controller 102.

As described above, in the embodiment, positional information representing positions of each of multiple locating holes 150A made in advance in PWB 150 is obtained; control point coordinate information representing coordinates of each of multiple control points corresponding to positions of locating holes 150A is derived on the basis of the positional information; on the basis of the control point coordinate information, the coordinate point of an image before deformation is operated, corresponding to an arbitrary point in the image after deformation; image information representing images after deformation is generated by applying, as pixel information of the arbitrary point, pixel information representing the image before deformation of the coordinate point operated; and because images as they exist after deformation are formed in PWB 150 on the basis of the image information generated, displacement of forming positions of an image can be corrected with a high degree of accuracy, even when PWB 150 is strained into an arbitrary shape.

Further, in the embodiment, locating holes 150A which have been made in advance in PWB 150 for positioning during image forming are used as reference marks of the invention, so that an additional step is not required for provision of reference marks, and the invention can be simply realized at low cost.

Although forming element unit 166 including a DMD as the spatial light modulator has been described in the embodiment, in addition to a reflection-type spatial light modulator such as a DMD, it is also possible to use a transmission type spatial light modulator (LCD). For example, the MEMS (Micro Electro Mechanical Systems) type spatial light modulator, an optical element (PLZT element) modulating transmitted light by electro-optic effects, and a liquid crystal shutter array such as a liquid crystal optical shutter (FLC) can be also used. The micro system in which the micro-size sensor, the micro-size actuator, and the micro-size control circuit are made and integrated by micromachining technology based on an IC manufacturing process is generally called MEMS, and a MEMS type spatial light modulator means one which is driven by an electromechanical operation utilizing electrostatic force. Further, multiple Grating Light Valves (GLV), arranged and formed two-dimensionally, can be also used. In configurations using the reflection-type spatial light modulator (GLV), or the transmission type spatial light modulator (LCD), in addition to laser, other lamps can be also used as the light source.

A fiber array light source including multiple multiplexing laser light sources, a fiber array light source in which fiber light sources are arrayed, including one optical fiber emitting the laser beam incident from a single semiconductor laser having one light emitting point, a light source in which multiple light emitting points are two-dimensionally arrayed (for example, an LD array and an organic EL array) can all be applied as the light source in the embodiment.

In addition to the exposure of a DFR in the manufacturing process of the above printed wiring board, image forming apparatus 100 of the embodiment can be preferably used for applications such as formation of a color filter in the manufacturing process of a liquid crystal display device (LCD), exposure of dry film resist (DFR) in the manufacturing process of a TFT, and exposure of a DFR in the manufacturing process of a plasma display panel (PDP).

Although a case has been described in the embodiment, in which the coordinate of coordinate points S(u,v) corresponding to all points subjected to processing is calculated from equation (3), the invention is not limited to such a case.

In other words, when v is set to a fixed value, it has been discovered that equation (3) is a linear function of u. Accordingly, when v is determined, the initial value (starting point) and the increments (increments corresponding to increments of u) can be easily determined. The use of the initial value and increments enables subsequent operations to be a simple adding operation, and operations can also be speeded up.

Although a case has been described in the embodiment, in which locating holes 150A made in advance in PWB 150 are used as reference marks of the invention, the invention is not limited to such a case. For example, a mark such as a locating mark formed in the forming of the previous wiring pattern can be also used as the reference mark of the invention. In these circumstances, the same effects as in the embodiment can be also obtained.

The configuration of image forming apparatus 100 described in the embodiment is no more than an example (see FIGS. 4, 5, and 10 to 12), and the configuration can be modified as appropriate within the scope of the invention.

Further, the flow of processing during the scanning exposure of image forming apparatus 100 and the flow of the image deformation process (see FIG. 11) described in the embodiment are also no more than examples, and the configuration can be appropriately modified within the scope of the invention.

In various embodiments described above explanations have been given on the basis of cases in which quadrilateral areas have been utilized as the divided areas of the invention. However, the invention is not limited to such cases, and it is possible to use, as the divided areas of the invention, configurations of geometrical areas with multiple angular outlines, such as triangles, pentagonal figures, hexagonal figures and figures with more than six angles. In the same way as in the case of quadrilateral areas, in the case of triangular and other areas, by using the boundaries of the divided areas and control points as reference marks, from the areas after deformation it is possible to designate points of areas before deformation.

Moreover, it is possible to consider as image data data that has been designed for the purpose of forming images, and on the other hand to call "drawing data" data that is used for drawing actual images. In these circumstances, in the various embodiments described above, by designating, from points within divided areas which are based on the actual measurements of boards, points within divided areas which in contrast are based on measurements of boards which have been designed, in each of the divided areas it is possible to determine drawing data from image data.

What is claimed is:

1. An image forming apparatus comprising:
   an obtaining component which obtains positional information representing positions of each of a plurality of reference marks provided in advance in a recording medium on which an image is formed;
   a converting component which, on the basis of the positional information, virtually divides a forming area of the image in the recording medium into a plurality of geometrical areas with angular outlines, and in each divided area converts image data representing the image so that the image is matched to a corresponding image for a corresponding divided area without deformation; and a forming component which forms the image on the recording medium on the basis of the converted image data.

2. The image forming apparatus of claim 1, wherein the reference marks have been provided in the recording medium in advance for the purpose of positioning during image forming.

3. The image forming apparatus of claim 1, wherein the geometrical areas with angular outlines are quadrilateral areas.

4. The image forming apparatus of claim 1, wherein the converting component includes:
- a deriving component which, on the basis of the positional information, derives control point coordinate information representing coordinates of each of a plurality of control points corresponding to the plurality of reference marks;
- an operating component which, on the basis of the control point coordinate information, operates coordinate points of an image before deformation corresponding to arbitrary points of an image after deformation; and
- a generating component which, by applying as image data of the arbitrary points, image data operated by the operating component, representing the image before deformation of the coordinate point operated by the operating component, generates image data representing an image after deformation.

5. The image forming apparatus of claim 4, wherein the operating component operates the coordinate points of the image before deformation by a Free Form Deformation (FFD) method.

6. The image forming apparatus of claim 1, wherein the converting component includes,
- an area designation section, which designates the corresponding divided area for the each divided area;
- a point designation section, which designates a plurality of points within the corresponding divided area, which corresponds to the plurality of points within the each divided area; and
- an obtaining section, which obtains the converted image data for each of the plurality of points within the each divided area based on corresponding image data of each of the plurality of points within the corresponding divided area.

7. An image forming method, comprising:
- obtaining positional information representing positions of each of a plurality of reference marks provided in advance in a recording medium;
- on the basis of the positional information, virtually dividing forming area of an image on the recording medium into a plurality of geometrical areas with angular outlines;
- in each divided area converting image data representing the image so that the image is matched to a corresponding image for a corresponding divided area without deformation; and
- on the basis of the converted image data, forming the image on the recording medium.

8. The image forming method of claim 7, wherein the conversion of image data comprises:
- on the basis of the positional information, deriving control point coordinate information representing a plurality of control point coordinates corresponding to each of a plurality of reference marks;
- on the basis of the control point coordinate information, operating coordinate points of an image before deformation corresponding to arbitrary points of an image after deformation; and
- applying, as image data of the arbitrary points, image data, which has been operated, corresponding to the coordinate points of an image before deformation, and thereby generating, as post-deformation image data, image data after deformation.

9. The image forming method of claim 7, wherein, conversion of image data comprises:
- designating the corresponding divided area for the each divided area;
- designating a plurality of points within the corresponding divided area which corresponds to a plurality of points within the each divided area; and
- obtaining the converted image data for each of the plurality of points within the each divided area based on corresponding image data of each of the plurality of points within the corresponding divided area.

10. A storage medium, including a computer program capable of causing a computer to execute steps comprising:
- obtaining positional information representing positions of each of a plurality of reference marks provided in advance in a recording medium;
- on the basis of the positional information, virtually dividing forming area of an image on the recording medium into a plurality of geometrical areas with angular outlines;
- in each divided area converting image data representing the image so that the image is matched to a corresponding image for a corresponding divided area without deformation; and
- on the basis of the converted image data, forming the image on the recording medium.

* * * * *